United States Patent [19]

Kawai et al.

[11] Patent Number: 4,821,299

[45] Date of Patent: Apr. 11, 1989

[54] SEMICONDUCTOR INTEGRATED CIRCUIT DEVICE INCLUDING SHIFT REGISTER HAVING SUBSTANTIALLY EQUALIZED WIRING BETWEEN STAGES THEREOF

[75] Inventors: Hideki Kawai, Nara; Masaru Fujii, Takatsuki; Kiyoto Ohta, Takatsuki; Masahiko Sakagami, Takatsuki, all of Japan

[73] Assignee: Matsushita Electronics Corporation, Kaodma, Japan

[21] Appl. No.: 15,347

[22] Filed: Feb. 17, 1987

[30] Foreign Application Priority Data

Feb. 18, 1986 [JP] Japan .................................. 61-34677

[51] Int. Cl.$^4$ ...................... G11C 19/00; H03K 23/54
[52] U.S. Cl. ........................................ 377/69; 377/77; 377/118; 377/126
[58] Field of Search ...................... 377/69, 77, 78, 79, 377/118, 119, 126

[56] References Cited

U.S. PATENT DOCUMENTS

| | | |
|---|---|---|
| 3,683,203 | 8/1972 | Smith ..................................... 377/79 |
| 4,224,531 | 9/1980 | Ebihara et al. ........................ 377/79 |
| 4,665,538 | 5/1987 | Machida ................................. 377/69 |

Primary Examiner—John S. Heyman
Attorney, Agent, or Firm—Wenderoth, Lind & Ponack

[57] ABSTRACT

In a semiconductor integrated circuit device having at least one shift register, a plurality of 5 stages of the shift register are electrically connected in series, the 1st stage of said shift register is located in the closest position to the data input terminal, and other succeeding stages are sequentially and straightly located at intervals; the chain of the stages is folded at a particular stage, and further succeeding stages are sequentially and straightly located at intervals so as to fill in the spaces between the other stages, thus, the unbalance of the load capacitance between said stages and the functional unbalance between the shift registers can be minimized.

6 Claims, 5 Drawing Sheets

FIG. 2
FIG. 3
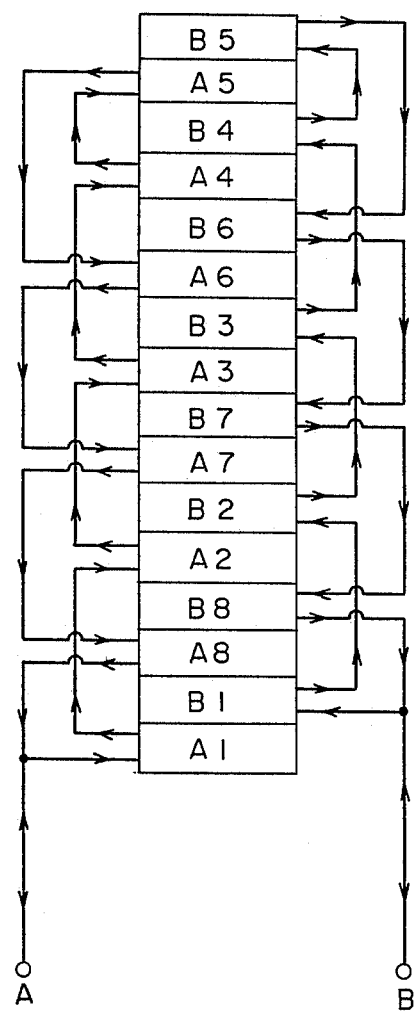
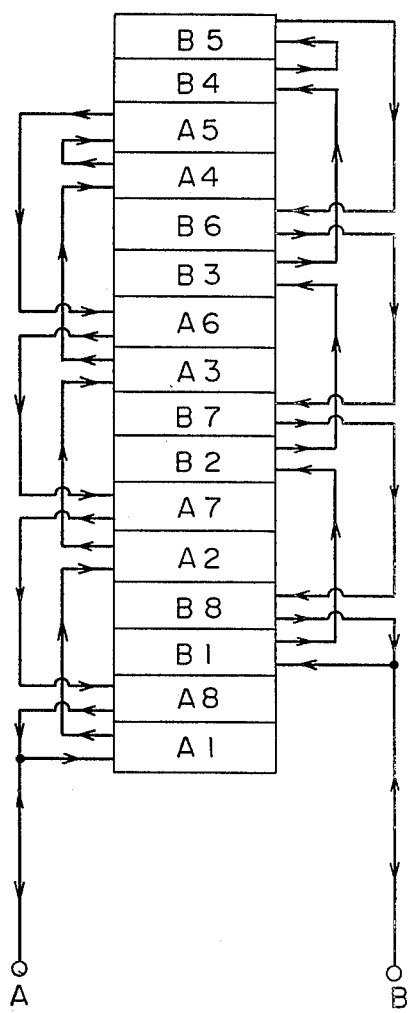

SEMICONDUCTOR INTEGRATED CIRCUIT DEVICE INCLUDING SHIFT REGISTER HAVING SUBSTANTIALLY EQUALIZED WIRING BETWEEN STAGES THEREOF

BACKGROUND OF THE INVENTION

This invention relates to a new semiconductor integrated circuit device, and more specifically, relates to a semiconductor integrated circuit device including a shift register.

In the semiconductor integrated circuit device, a shift register is one of the most important element. Usually, when a shift register having a plurality of register stages is formed on the semiconductor substrate, said stages are arranged straightly in a numerical order. For example, as shown in FIG. 5, when the first shift register is comprised of 8 stages A1, A2, A3, A4, A5, A6, A7 and A8, such stages are arranged straightly from the 1st stage A1 to the 8th stage A8. Likewise, as to the second shift register, 8 stages B1, B2, B3, B4, B5, B6, B7 and B8 are arranged straightly from the 1st stage B1 to the 8th stage B8. When the first shift register is used as a circular type shift register, input data from the input/output terminal A is supplie to the 1st stage A1 and then transferred to the 2nd stage A2 and then transferred to the 3rd, 4th, 5th, 6th, 7th and 8th stages in sequence along the arrrowed lines shown in FIG. 5. The output data from the 8th stage A8 is fed-back to the 1st stage A1 and the input/output terminal A. Also the second shift register, input data from the input/output terminal B is supplied to the 1st stage B1 and then transferred to the 2nd, 3rd, ..., 7th and 8th stages in sequence, and the output data from the 8th stage B8 is fed-back to the 1st stage B1 and the input/output terminal B. However, the above mentioned arrangement of the stages on the semiconductor substrate causes the following problems.

The first problem is that the load capacitance of each data line between the register stages becomes unequal. For example, in FIG. 5, the length of the data line from the 8th stage A8 to the 1st stage A1 is longer than that of other data lines. Consequently, the load capacitance of the former is bigger than the latter. As shown in FIG. 6, each stage is basically composed of two transfer gates Q1, Q2 and two buffers (inverter circuits) I1, I2. Therefore, in a semiconductor device shown in FIG. 5, it is necessary for the load driving capability of the output buffer I2 of the 8th stage A8 to be greater than that of the other stages. For this purpose, the size and circuit constants of the 8th stage have to be larger than that of the other stages. However, it is rather difficult to form a plurality of stages of different sizes on the semiconductor substrate. It is also possible that the size and the circuit constants of the 8th stage are designed so that the 8th stage has enough load driving capability, and the size and the circuit constants of other stages are designed so as to be equal to that of the 8th stage. However, in this case, other problems, such as total size and total power consumption cannot be reduced, etc., are caused.

The second problem is that the functional balance among several shift registers cannot be maintained. For example, in FIG. 5, the delay time of the data from the terminal A to the 1st stage A1 of the first stage register is shorter than the delay time of the data from the terminal B to the 1st stage B1 of the second shift register. This problem becomes much more serious when a shift register has a lot of stages or a lot of shift registers are arranged straightly for a long length.

SUMMARY OF THE INVENTION

Accordingly, an object of the present invention is to provide a semiconductor integrated circuit device in which a plurality of stages of a shift register are arranged so that the unbalance of the load capacitance between said stages can be minimized.

Another object of the present invention is to provide a semiconductor integrated circuit device in which a plurality of stages of several shift registers are arranged so that the functional balance among several shift registers can be maintained.

The present invention may be briefly summarized as a semiconductor integrated circuit device having at least one shift register, wherein a plurality of stages of said shift register are electrically connected in series, and the 1st stage of said shift register is located in the closest position to the data input terminal, and other succeeding stages are sequentially and straightly located at intervals; the chain of stages is folded at a particular stage, and further succeeding stages are sequentially and straightly located at intervals so as to fill in the spaces between said other stages.

BRIEF DESCRIPTION OF THE DRAWINGS

Other features and objects of the present invention will be apparent from the following description taken in conjunction with the accompanying drawings, in which:

FIGS. 2 and 3 show plane views of a semiconductor integrated circuit device, especially a layout of stages of two shift registers according to the present invention;

DETAILED DESCRIPTION OF THE PREFERRED EMBODIMENTS

Figure 1:
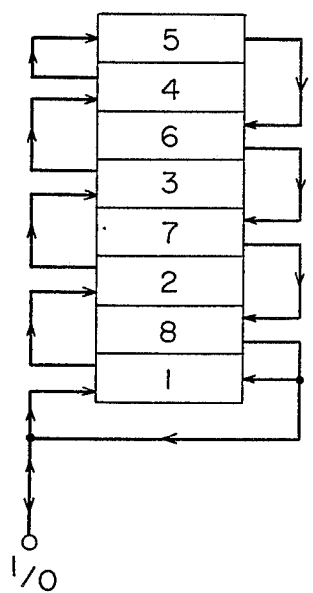
FIG. 1 shows a plane view of a semiconductor integrated circuit device, especially a layout of stages of a shift register according to the present invention.

FIG. 1 shows the first embodiment according to the present invention; more specifically, FIG. 1 shows a new arrangement of 8 register stages which comprise a one channel shift registser. As shown in FIG. 1, the 1st stage 1 is located in the nearest position to the input/output terminal I/O, and the 2nd, 3rd and 4th stages 2, 3, and 4 are located in every other position. The 5th stage 5 is located contiguously to the 4th stage 4. A chain of said stages is folded at the 5th stage 5, and the 6th, 7th and 8th stages 6, 7 and 8 are also located in every other position so as to fill in the spaces between the 1st, 2nd, 3rd and 4th stages 1, 2, 3 and 4. Consequently, the last stage 8 is located in the nearest position to the 1st stage 1. In the above described construction, input data from the terminal I/O is supplied to the 1st stage 1 and then transferred to the 2nd stage 2 and then transferred to the 3rd, 4th, 5th, 6th, 7th and 8th stages in sequence along the arrowed lines shown in FIG. 1. The output data from the 8th stage 8 is fed-back to the 1st stage 1 and the terminal I/O. Therefore, the basic operation as shift-register is the same as that of conventional device shown in FIG. 5. However, the length of each data line between a particular stage and the next stage is approximately equal due to the above mentioned layout. As a result, the unbalance of load capacitance of each data line is minimized, and therefore, it is not necessary to make the load driving capability of the output buffer of a particular stage stronger.

FIG. 2 shows the second embodiment according to the present invention; more specifically, FIG. 2 shows a new arrangement of 16 register stages which comprise two channels of shift registers. In FIG. 2, stages A1–A8 comprise the first shift register, and stages B1–B8 comprise the second shift register. The 1st stage A1 of the first shift register is located in the nearest position to the input/out (I/O) terminal A, and the 2nd, 3rd, and 4th stages A2, A3 and A4 are located in every fourth position from the 1st stage A1. Further, the 5th stage A5 is located in the next position but one to the 4th stage A4. A chain of said stages of the first shift register to folded at the 5th stage A5, and the 6th, 7th and 8th stages A6, A7 and A8 are also located in every fourth position from the 5th stage A5 to the 1st stage A1. As to the second shift register, the 1st stage B1 is located in the position contiguously to the 1st stage A1 of the first shift register, in other words, in the nearest position to the I/O terminal B. The 2nd, 3rd and 4th stage B2, B3 and B4 are located in every fourth position from the 1st stage B1. The 5th stage B5 is located in the next position but one to the 4th stage B4. A chain of said stages of the second shift registesr is also folded at the 5th stage B5, and the 6th, 7th and 8th stages B6, B7 and B8 are located in every fourth position from the 5th stage B5 to the 1st stage B1. In the above described construction, input data from the I/O terminal A is supplied to the 1st stage A1 and then transferred to the 2nd stage A2 and then transferred to the 3rd, 4th, 5th, 6th, 7th and 8th stages in sequence along the arrowed lines. The output data from the 8th stage A8 is fed-back to the 1st stage A1 and the I/O terminal A. Also, as to input data from the I/O terminal B, it is transferred through all stages B1–B8 of the second shift register in sequence and fedback to the 8th stage B8 and the terminal B just like as the first stage register. Therefore, in this embodiment, the basic operations of the first and second shift registers are the same as that of conventional device shown in FIG. 5. However, the length of each data line between a particular stage and the next stage becomes approximately equal due to the layout shown in FIG. 2. Therefore, the unbalance of load capacitance of each data line is minimized, and as a result, it is not necessary to make the load driving capability of the output buffer of particular stage stronger. Futhermore, in the above described construction shown in FIG. 2, the functional balance between the first and second shift registers can be maintained, because the length of the data line between I/O terminal A and the 1st stage A1 of the first shift register is approximately equal to the length of the data line between I/O terminal B and the 1st stage B1 of the second shift register, and the delay time of said data lines are also approximately equal.

FIG. 3 shows the third embodiment according to the present invention; more specifically, FIG. 3 shows a slightly modified version of the second embodiment shown in FIG. 2. In FIG. 3, stages A1–A8 comprise the first shift register, and stages B1–B8 comprise the second shift register. The 1st stage A1 of the first shift register is located in the nearest position to the I/O terminal A, and the 2nd, 3rd and 4th stages A2, A3 and A4 are located in every fourth position from the 1st stage A1. The 5th stage A5 is located in the next position to the 4th stage A4, and a chain of said stage is folded at the 5th stage A5. The 6th, 7th and 8th stage A6, A7 and A8 are located in every fourth position from the 5th stages A5 to the 1st stage A1. As to the second shift register, the 1st atage B1 is located continquously to the 8th stage A8 of the first shift register, and other stage B2-B8 are located in the same manner of the stages A2-A8 of the first shift register. The data from the I/O terminals A and B are transferred along the arrowed lines shown in FIG. 3. In this embodiment, the length of each data line between a particular stage and the next stage becomes nearly equal. Therefore, the unbalance of load capacitance of each data line can be reduced. The functional balance between the first and second shift registers can be well maintained.

Figure 4:
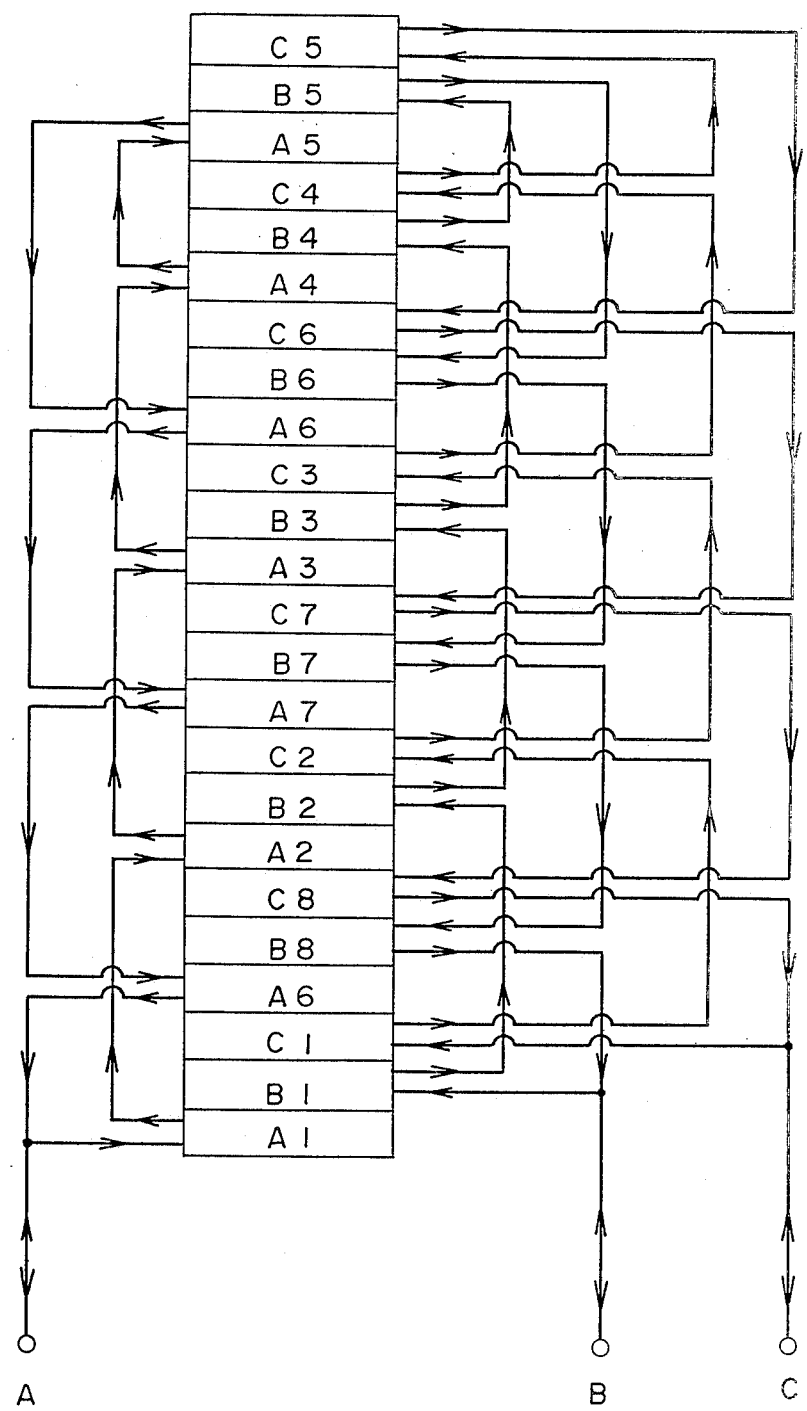
FIG. 4 shows a plane view of a semiconductor integrated circuit device, especially a layout of stages of three shift registers according to the present invention.

FIG. 4 shows the fourth embodiment according to the present invention. This embodiment shows a layout of 24 register stages which comprise three channels of shift registers. In FIG. 4, stages A1–A8, B1–B8 and C1–C8 comprise the first, second and third shift registers respectively. Each group of said stages is arranged just like as the order of FIG. 2. In this embodiment, the length of each data line between a particular stage and the next stage becomes approximately equal. Therefore, the unbalance of load capacitance of each data line can be reduced. Of course, as to the functional balance between the first, second and third shaft registers, it can be maintained.

Figure 5:
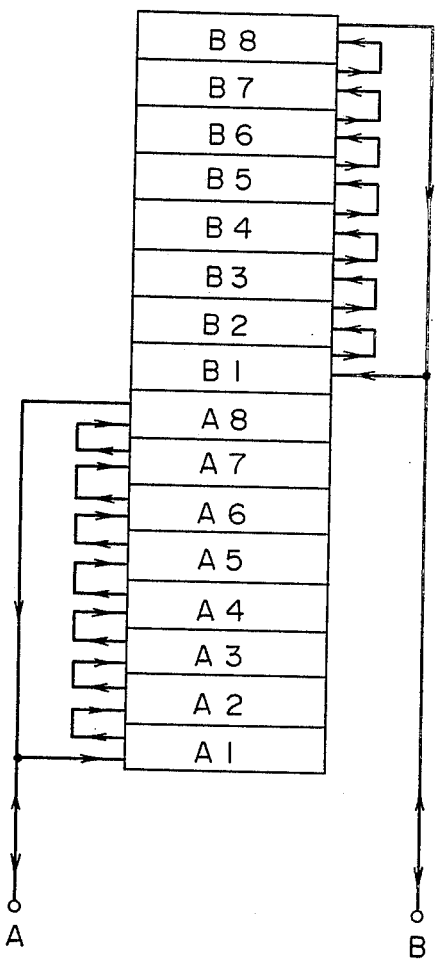
FIG. 5 shows a plane view of a conventional semiconductor integrated circuit device.
Figure 6:
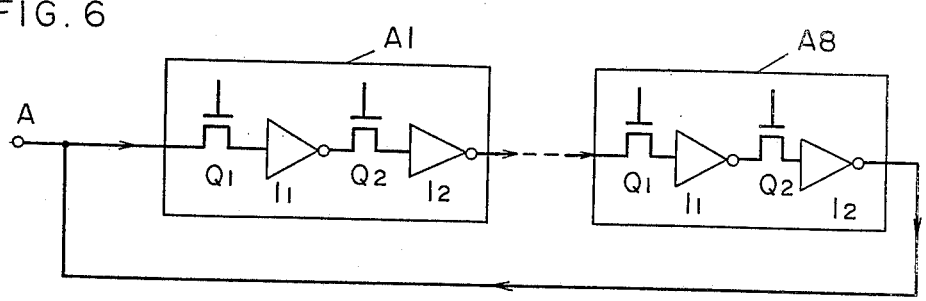
FIG. 6 shows a schematic diagram of a shift register used for conventional device or the present invention.

In both the embodiments (FIGS. 1–4) and the prior art (FIG. 5), each stage of a shift register is comprised of two transfer gates Q1, Q2 and two buffers I1, I2 as shown in FIG. 6. Practically, parasitic capacitance (not shown in FIG. 6) exists between the wire and the ground potential in the input terminal of each buffer I1 or I2, and the parasitic capacitance stores the data "1" or "0" transferred by the transfer gate Q1 or Q2. Transfer gates Q1 and Q2 are turned on/off by two clock signals 01, 02 shown in FIG. 7A and 7B. The phases of clock signals 01, 02 are slightly different (t).

Figure 7A:
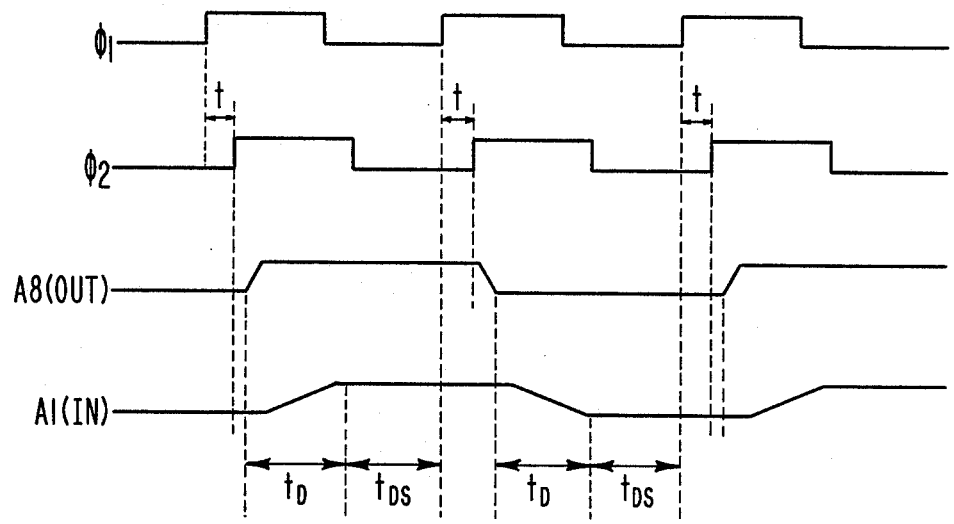
FIGS. 7A and 7B are waveform charts which respectively show the waveforms of the prior art device and the devices of the present invention.
Figure 7B:
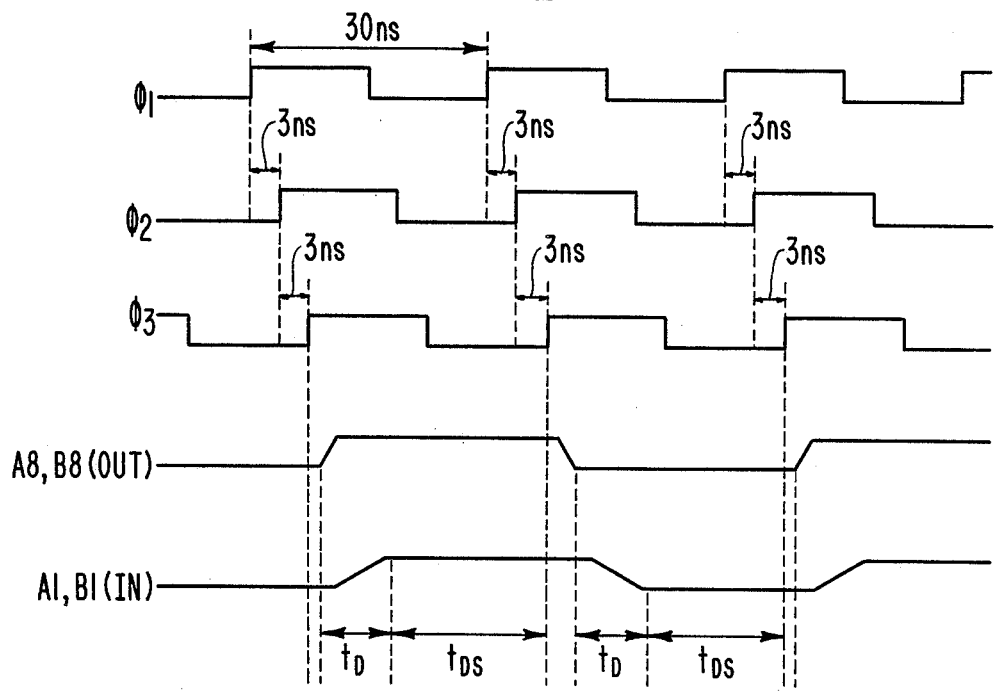

Under the arrangement of FIG. 5 (prior art), when the output data of the stage A8 rises or falls as shown in FIG. 7A, the input data of the stage A1 rises or falls with time delay ($t_D$). Because the wire between stages A8 and A1 is long, the time constant $T = R \cdot C$ (R: resistance of the wire, and C: parasitic capacitance of the wire) cannot be ignored as compared with the data transfer speed. The time constant $\tau$ causes such a time delay ($t_D$). As a result, the data set up time ($t_{DS}$) becomes shorter. During the data set up time ($t_{DS}$), transfer gate Q1 or Q2 is turned on and the data must be stored in the buffer I1 or I2 (i.e. parastici capacitance) in such a period ($t_{DS}$). However, when the data set up time ($t_{DS}$) becomes shorter, it is difficult to turn on the transfer gate Q1 and Q2 and to store the data in the parasitic capacitance in such a short period, and a malfunction may be caused. When the frequency of the clock signals 01, 02 is low, even if the time delay ($t_D$) becomes long, there is some margin of the data set up time ($t_{DS}$), and therefore, a malfunction may be avoidable. However, when the frequency of the clock signals 01, 02 is high, the data setup time ($t_{DS}$) becomes quite short. Then, a malfunction of the data set up is inevitable.

On the other hand, under the arrangement of the embodiments of the present invention, (FIGS. 1-4), the time delay between all stages becomes substantially uniform due to the uniformity of the length of wire between all stages, and a particular long time delay does not occur. Therefore, in the embodiments of the present invention, even if a shift register has the same number of stages, and each stage has the same construction, and further, the frequency of the clock signals are the same as those of the prior art (FIG. 5), the data set up time ($t_{DS}$) is maintained for a longer time than that of the prior art (FIG. 5), see FIG. 7B.

Meanwhile, the frequency of the clock signal, which does not cause a malfunction of the data set up function should be changed according to the number of stages of the shift register, the structure of each stage, or the necessary target of the device in which said shaft register is fabricated, etc. In other words, the parameters such as clock frequnecy, etc., which cause the desirable effects of the present invention, can not be determined.

One particular sample which the inventors have experimented upon is as follows. (See FIG. 7B)

Number of shift registers — 2
Number of stages of each shift register — 8
Structure of each stage — three transfer gates and three buffers for sampling, latching and deliverying the data respectively
Therefore, the number of clock signals — 3 (01, 02, 03)
The frequency of each clock signal — 33 MHz
Therefore, the period of each clock signal — 30nS(i.e. — 1/33MHz)
Time difference between each clock signal — 3nS
Desirable length of data set up time ($t_{DS}$) — more than 15 nS Under the abovenoted conditions, in a prior art arrangement shown in FIG. 5, the time constant ($\tau$) of the wires between A8(B8) and A1(B1) is about 5 nS, and time delay ($t_D$) is about 15 nS.

Therefore, the data set up time ($t_{DS}$) becomes as follows.

$$t_{DS} = 30 - 3 - 3 - 15$$
$$= 9 \, nS$$

Since the desirable length of the data set up time ($t_{DS}$) is more than 15 nS, the prior art arrangement could not reach this target.

On the other hand, in an arrangement of the embodiment shown in FIG. 2, the average time constant ($\tau$) between the stages is about 1 nS, and time delay ($t_D$) is about 3 nS. Therefore, the data set up time ($t_{DS}$) becomes as follows.

$$t_{DS} = 30 - 3 - 3 - 3$$
$$= 21 \, nS$$

21 nS is long enough compared with the desirable length of $t_{DS}$ (i.e. more than 15 nS). Thus, according to the present invention, the design target of a device is easily reached.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention. For example, in the above mentioned embodiment, although the data terminal is shown as common terminal for input and output data, this invention is applicable to a device which has separate terminals for data input and output, and these terminals are located in closer positions to each other.

What we claim is:

1. A semiconductor integrated circuit device having a shift register which has a plurality of stages electrically connected in series, wherein a first stage of said shift register is located at a closest position to a data input terminal, and other succeeding stages are sequentially and straightly located in every other position leaving spaces therebetween, and the chain of said stages is folded at a particular stage, and further succeeding stages are sequentially and straightly located in every other position so as to fill in the spaces between said every other stage, and wherein a last stage is located at a closest position to a data output terminal, whereby the wiring between said stages is substantially equalized so as to substantially equalize time delays therebetween.

2. A semiconductor integrated circuit device according to claim 1, said input terminal and said output terminal are the same terminal.

3. A semiconductor integrated circuit device according to claim 1, wherein the output data of the last stage is fed-back to the 1st stage.

4. A semiconductor integrated circuit device having a plurality of shift registers; wherein each shift register has a plurality of stages electrically connected in series, and a first stage of a first shift register is located in a closest position to a first input terminal, and other succeeding stages are sequentially and straightly located at intervals leaving spaces between said succeeding stages, the chain of said stages of said first shift register is folded at a particular stage, and further succeeding stages thereof are sequentially and straightly located within said intervals so as to fill in the spaces between said other succeeding stages, and a last stage is located at a closest position to a first output terminal, and other chains of stages of a second and further shaft registers are located in substantially the same manner as said first shift register so as to fill in the spaced between the other and further succeeding stages of said first shift register and so as to locate first and last stages of said second and further shift registers in closest portions to their respective input and output terminals whereby the wiring between said respective stages of said shift registers is substantially equalized so as to substantially equalize time delays therebetween.

5. A semiconductor integrated circuit device according to claim 4, wherein said input and output terminals corresponding to each shift register are the same terminals respectively.

6. A semiconductor integrated circuit device according to claim 4, the output data of the last stage of each shift register is fed-back to the 1st stage of each shift register.

* * * * *